US011018663B2

(12) United States Patent
Son et al.

(10) Patent No.: US 11,018,663 B2
(45) Date of Patent: May 25, 2021

(54) LINEAR SWITCH CIRCUITS AND METHODS

(71) Applicant: TEXAS INSTRUMENTS INCORPORATED, Dallas, TX (US)

(72) Inventors: Roland Karl Son, Richardson, TX (US); Craig Bennett Greenberg, Mt. Vernon, TX (US); Indumini Ranmuthu, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/984,015

(22) Filed: Aug. 3, 2020

(65) Prior Publication Data

US 2021/0091764 A1 Mar. 25, 2021

Related U.S. Application Data

(60) Provisional application No. 62/903,494, filed on Sep. 20, 2019.

(51) Int. Cl.
*H03K 17/08* (2006.01)
*H03K 17/14* (2006.01)
*H03K 17/687* (2006.01)

(52) U.S. Cl.
CPC ......... *H03K 17/145* (2013.01); *H03K 17/687* (2013.01); *H03K 2017/0806* (2013.01)

(58) Field of Classification Search
CPC ...... H03K 17/06; H03K 17/063; H03K 17/08; H03K 17/0812; H03K 17/08122; H03K 17/14; H03K 17/145; H03K 17/18; H03K 17/687; H03K 2017/0806
USPC .................................................. 327/365, 378
See application file for complete search history.

(56) References Cited

U.S. PATENT DOCUMENTS 5,182,479 A * 1/1993 Behagel ........... H03K 17/08122 327/288
6,353,309 B1 * 3/2002 Ootani ................ H03K 17/122 323/282
10,771,053 B2 * 9/2020 Eguchi ............... H03K 17/6871
2002/0021114 A1 * 2/2002 Marino ............... H02M 3/1584 323/272

(Continued)

*Primary Examiner* — William Hernandez
(74) *Attorney, Agent, or Firm* — Michelle F. Murray; Charles A. Brill; Frank D. Cimino

(57) ABSTRACT

A system includes an output terminal and a linear switch circuit coupled to the output terminal. The linear switch circuit includes a first power field-effect transistor (FET) having: a first channel width; a control terminal; a first current terminal; and a second current terminal, wherein the second current terminal is coupled to the output terminal. The linear switch circuit also includes a second power FET having: a second channel width smaller than the first channel width; a control terminal; a first current terminal coupled to the first current terminal of the first power FET; and a second current terminal coupled to the output terminal. The system also comprises a control circuit coupled to the control terminal of the first power FET and to the control terminal of the second power FET. The control circuit detects a drain-to-source voltage ($V_{DS}$) saturation condition and controls the first and second power FETs accordingly.

22 Claims, 8 Drawing Sheets

(56) References Cited

U.S. PATENT DOCUMENTS

2011/0199146 A1* 8/2011 Bakalski ................. H02M 3/07
327/427
2017/0363662 A1* 12/2017 Neidorff .............. H03K 17/687

* cited by examiner

700

21
8.0
0.0
V (V)
VIN
VOUT
1.1
0.7
0.3
-0.1
I (A)
I_LITTLE_FET
1.1
0.7
0.3
-0.1
I (A)
I_BIG_FET
0.0 5.0 10.0 15.0 20.0 25.0 30.0 35.0 40.0 45.0 50.0 55.0 60.0
TIME (ms)
LOAD RESISTANCE DECREASED WITH TIME 800
801
CONTROL CIRCUIT
808
FIRST POWER FET
802A
SECOND
POWER FET
804
THERMAL
SENSE DIODE
806
FIRST POWER FET
802B

LINEAR SWITCH CIRCUITS AND METHODS

CROSS-REFERENCE TO RELATED APPLICATION

This application claims priority to U.S. Provisional Application No. 62/903,494, filed Sep. 20, 2019, which Application is hereby incorporated herein by reference in its entirety.

BACKGROUND

The proliferation of electronic devices and integrated circuit (IC) technology has resulted in the commercialization of IC products. As new electronic devices are developed and IC technology advances, new IC products are commercialized. Many IC products use power field-effect transistors (FETs), where the safe operating area (SOA) of the power FETs becomes more limited as IC technology progresses towards miniaturization.

SUMMARY

In accordance with at least one example of the disclosure, a system includes an output terminal and a linear switch circuit coupled to the output terminal. The linear switch circuit includes a first power field-effect transistor (FET) having: a first channel width; a control terminal; a first current terminal; and a second current terminal, wherein the second current terminal is coupled to the output terminal. The linear switch circuit also includes a second power FET having: a second channel width smaller than the first channel width; a control terminal; a first current terminal coupled to the first current terminal of the first power FET; and a second current terminal coupled to the output terminal. The system also comprises a control circuit coupled to the control terminal of the first power FET and to the control terminal of the second power FET. The control circuit is configured to: detect a drain-to-source voltage ($V_{DS}$) saturation condition related to the first power FET; adjust a first drive signal to the control terminal of first power FET to reduce current flow through the first power FET responsive to the detecting the $V_{DS}$ saturation condition; and adjust a second drive signal to the control terminal of the second power FET to increase current flow through the second power FET responsive to the detecting the $V_{DS}$ saturation condition.

In accordance with at least one example of the disclosure, an integrated circuit (IC) comprises a first power FET in a linear switch circuit. The monolithic IC also includes a second power FET in parallel with the first power FET in the linear switch circuit, wherein the second power FET is smaller than the first power FET with regard to channel width. The monolithic IC also includes a control circuit coupled to the first power FET and the second power FET, wherein the control circuit is configured to increase a gate drive signal to the second power FET and to decrease a gate drive signal to the first power FET in response to detecting a drain-to-source voltage ($V_{DS}$) saturation condition related to the first power FET.

In accordance with at least one example of the disclosure, a circuit comprises: an input voltage (VIN) terminal; an output voltage (VOUT) terminal; and a first power field-effect transistor (FET). The first power FET comprising: a first channel width; a control terminal; a first current terminal; and a second current terminal, wherein the second current terminal is coupled to the VOUT terminal. The circuit also comprises a second power FET comprising: a second channel width smaller than the first channel width; a control terminal; a first current terminal coupled to the first current terminal of the first power FET; and a second current terminal coupled to the VOUT terminal. The circuit also comprises a control circuit, wherein the control circuit comprises: a sense circuit; and a gate drive circuit coupled to the sense circuit and coupled to the control terminals of the first and second power FETs.

BRIEF DESCRIPTION OF THE DRAWINGS

For a detailed description of various examples, reference will now be made to the accompanying drawings in which.

DETAILED DESCRIPTION

Figure 1:
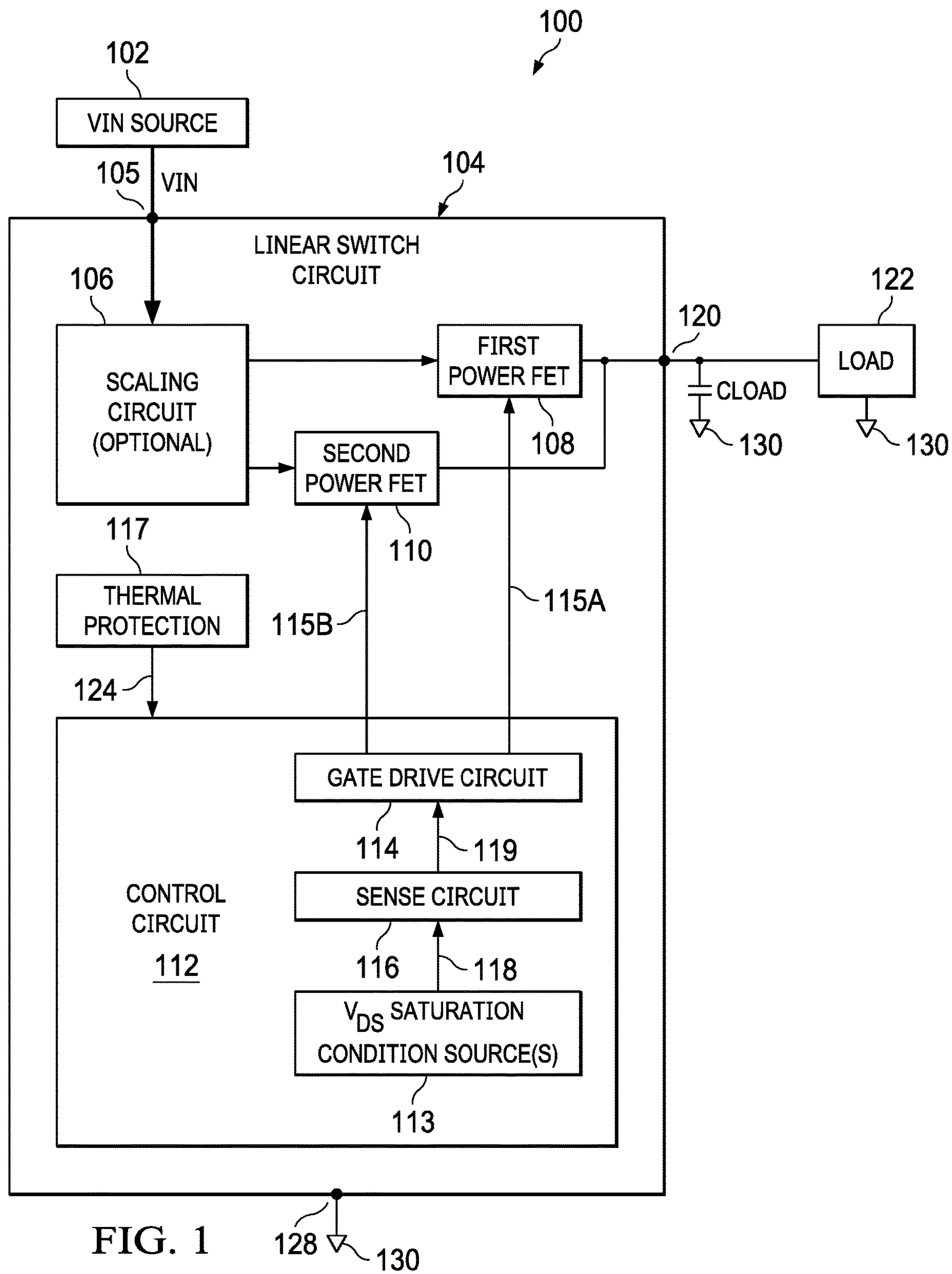
FIG. 1 is a block diagram showing a system in accordance with an example embodiment.

Described herein are linear switch circuit topologies or related systems with a power field-effect transistor (FET) and saturation condition protection. To avoid thermal runaway scenarios for a power FET, a drain-to-source voltage ($V_{DS}$) saturation condition for a first, or primary, power FET is monitored and an additional, or secondary, power FET is used instead of the first power FET as needed to avoid a lengthy $V_{DS}$ saturation condition for the first power FET and/or to avoid a thermal runaway condition for the first power FET.

When a power FET is operated in saturation with a gate-to-source voltage ($V_{GS}$) below the temperature compensation point (TCP), current focusing occurs due to the positive feedback loop between current density and temperature. At a given drain current and gate-to-source voltage ($V_{DS}$), the current is concentrated into a smaller and smaller region of the power FET as temperature increases, greatly increasing the power density in the region of the power FET that conducts the current.

When the rate at which power density increases with temperature exceeds the rate at which heat can be conducted away from the channel region, "thermal runaway" is said to occur, and the power FET is damaged. The exact area of the power FET where thermal runaway will occur can be unpredictable due to non-uniformities in the threshold voltage and the thermal environment of the power FET (e.g., package asymmetry). In one example, a thermal sense diode is placed in the center of the power FET, but due to the extreme concentration of current and power at different points of an IC and their distance from the thermal sense diode, the thermal sense diode may not be heated enough to activate the thermal shutdown protection feature.

There is a direct (~1/x) tradeoff between power FET specific on-state resistance ($R_{SP}$) and vulnerability to thermal runaway (TCP at high drain current density "$J_D$" in A/mm$^2$). For cost and size reasons, it is desirable to use very low on-resistance ($R_{SP}$) power FET technologies for linear switch applications (e.g., hot-swap/soft-start switches, current limit switches, and power multiplexers). For example, in a Universal Serial Bus Power Delivery (USB-PD) device, a 30V stand-off, back-to-back switch is needed with a 6 mΩ typical total on-resistance, where the switch needs to fit into a 6×6 mm multi-chip module (MCM) with a large controller die. While miniaturization of IC circuits helps to meet the size target with low $R_{SP}$, there is a trade-off as the TCP is high, resulting in a corresponding vulnerability to thermal runaway.

In at least some described embodiments, the first power FET has a low on-resistance ($R_{SP}$) and conducts current for a linear switch circuit during normal conditions (e.g., when $V_{DS}$ is below a threshold, when load current is below a threshold, when there are no faults, and/or after a start-up event is complete). The second power FET is in parallel with the first power FET, and is smaller than the first power FET with regard to channel width (W) or W/L, where L is the channel length. The second (smaller) power FET has a higher $R_{SP}$ compared to the $R_{SP}$ of the first power FET, and is able to handle a higher $V_{DS}$ and/or higher temperatures without thermal runaway. In operation, the second power FET is configured to conduct current for a linear switch circuit in response to a $V_{DS}$ saturation condition of the first power FET. In example embodiments, the $V_{DS}$ saturation condition of the first power FET may be detected in different ways. Without limitation, example $V_{DS}$ saturation condition detection options for the first power FET include: 1) measuring $V_{DS}$ of the first power FET and comparing the measured $V_{DS}$ to a threshold; 2) measuring the current through the first power FET ($I_{BIG\_FET}$) and/or a sense current through a related current path (e.g., a current mirror sense current path that provides an indication of $I_{BIG\_FET}$), and comparing $I_{BIG\_FET}$ to a threshold; 3) detecting a start-up event; and/or 4) detecting a fault condition.

By using the second (smaller) power FET to conduct current during the $V_{DS}$ saturation condition of the first power FET, thermal runaway of the first power FET is avoided. In one example embodiment, thermal runaway of the second power FET is also avoided by aligning a thermal sense diode or other temperature sensor within or near the IC material layout (footprint) or layers of the second (smaller) power FET, since the IC material layers of the second power FET is where hot spots occur that can ultimately lead to thermal runaway and failure of the second power FET. The exact position of the thermal sense diode relative to the IC material layout or layers of the second power FET may vary, but should enable the thermal sense diode to detect when thermal runaway of the second power FET is likely to occur within a threshold tolerance. Even though the second power FET is susceptible to thermal runaway at high voltage levels (e.g., when the $V_{DS}$ saturation condition of the first power FET exists), the thermal sense diode aligned with the second power FET is able to detect when the second power FET has reached a temperature indicating thermal runaway. In response to a high temperature detection at the second power FET, the second power FET is turned off to prevent damage.

Instead of facing unpredictable thermal runaway scenarios and/or using a more complex temperature sensor arrangement, at least some described embodiments use the second (smaller) power FET to conduct current in response to a $V_{DS}$ saturation condition of the first (larger) power FET in combination with a temperature sense aligned with the second power FET. Because the second power FET is smaller than the first power FET, thermal runaway of the second power FET is more predictable and/or easier to detect. By aligning the second power FET with a temperature sensor (part of a thermal protection circuit), thermal runaway of the second power FET can be detected and avoided. To provide a better understanding, various linear switch circuit options, thermal protection issues, and IC layout options are described using the figures as follows.

FIG. 1 is a block diagram showing a system 100 in accordance with an example embodiment. In FIG. 1, the system 100 is an example of a hot-swap switch, a soft-start switch, a current limit switch, or a power multiplexer. As shown, the system 100 includes an input voltage (VIN) source 102 coupled to a linear switch circuit 104. More specifically, the linear switch circuit 104 includes an input terminal 105 configured to receive VIN from the VIN source 102. In the example of FIG. 1, the input terminal 105 is coupled to a first power FET 108 and to a second power FET 110 in parallel with the first power FET 108 via an optional scaling circuit 106, where the second power FET 110 is smaller than the first power FET 108 with regard to W and/or W/L such that the second power FET 110 has a higher $R_{SP}$. In some example embodiments, the optional scaling circuit 106 scales VIN, which adjusts the voltage and current at an output terminal 120 of the linear switch circuit when the first power FET 108 and/or the second power FET 110 are on (conducting). Rather than a binary on/off state, the linear switch circuit 104 is able to linearly adjust the amount of current supplied to the output terminal 120 by adjusting the drive signals 115A and 115B for the first and second power FETs 108 and 110.

In one example, the amount of current supplied to the output terminal 120 is a function of a load 122 coupled to the output terminal 120, where the load 122 may be fixed or variable. If the load 122 is variable, monitoring of the voltage and/or current at the output terminal 120 of the linear switch circuit 104 may be used to adjust the drive signals 115A and 115B. In the example of FIG. 1, the load 122 is in parallel with a load capacitor (CLOAD) coupled between the output terminal 120 and a ground 130. As shown, the ground 130 is also coupled to a ground terminal 128 of the linear switch circuit 104. In some example, various components of the control circuit 112 and/or other components may be coupled to the ground terminal 128.

In operation, the first power FET 108 and the second power FET 110 are controlled by separate drive signals 115A and 115B from a control circuit 112. As shown, the control circuit 112 includes a gate drive circuit 114 coupled to a sense circuit 116 that is configured to detect a $V_{DS}$ saturation condition of the first power FET 108 based on input signal(s) 118 provided by $V_{DS}$ saturation condition source(s) 113. Without limitation, example $V_{DS}$ saturation condition detection options performed by the sense circuit 116 based on the input signal(s) 118 include: scenario 1) measuring $V_{DS}$ of the first power FET 108 and comparing the measured $V_{DS}$ to a threshold; scenario 2) measuring the current through the first power FET ($I_{BIG\_FET}$) and/or a current though a related current path and comparing $I_{BIG-}$ $_{FET}$ to a threshold; scenario 3) detecting a start-up event; and/or scenario 4) detecting a fault condition (e.g., a short-to-ground condition).

For scenario 1, an example of the $V_{DS}$ saturation condition source(s) 113 is the operation of the first power FET 108 to provide power to the load 122. Due to the $R_{SP}$ of the first power FET 108 being low, a $V_{DS}$ saturation condition of the first power FET 108 increases its vulnerability to thermal runaway, where $V_{DS}$ of the first power FET 108 is an indicator of a $V_{DS}$ saturation condition. Accordingly, for scenario 1, $V_{DS}$ of the first power FET 108 is measured and is compared to a threshold by the sense circuit 116. If $V_{DS}$ of the first power FET 108 is higher than the threshold (indicative of a $V_{DS}$ saturation condition of the first power FET 108), the sense circuit 116 provides the control signal 119 to adjust the operations of the first and second power FETs 108 and 110 (e.g., to reduce conduction by the first power FET 108 and to increase conduction by the second power FET 110). In some examples of scenario 1, the sense circuit 116 also accounts for a timing parameter such as whether the measured $V_{DS}$ of the first power FET 108 has been higher than the threshold for more than a threshold amount of time.

For scenario 2, an example of the $V_{DS}$ saturation condition source(s) 113 is again the operation of the first power FET 108 to provide power to the load 122. Due to the $R_{SP}$ of the first power FET 108 being low, a $V_{DS}$ saturation condition of the first power FET 108 increases its vulnerability to thermal runaway, where the current through the first power FET 108 is an indicator of a $V_{DS}$ saturation condition. Accordingly, for scenario 2, the current through the first power FET 108 is measured and is compared to a threshold by the sense circuit 116. If the current through the first power FET 108 is higher than the threshold (indicative of a $V_{DS}$ saturation condition of the first power FET 108), the sense circuit 116 provides the control signal 119 to adjust the operations of the first and second power FETs 108 and 110 (e.g., to reduce conduction by the first power FET 108 and to increase conduction by the second power FET 110). In some examples of scenario 2, the sense circuit 116 also accounts for a timing parameter such as whether the current through the first power FET 108 has been higher than the threshold for more than a threshold amount of time.

Another scenario 2 option involves sensing the current through the first power FET using a related current path. For example, a current mirror circuit coupled to one of the current terminals of the first power FET 108 is able to provide a sense current that is proportional to the current through the first power FET 108. This sense current provided by the current mirror is measured and is compared to a threshold by the sense circuit 116. If the measured sense current is higher than the threshold (indicative of a $V_{DS}$ saturation condition of the first power FET 108), the sense circuit 116 provides the control signal 119 to adjust the operations of the first and second power FETs 108 and 110 (e.g., to reduce conduction by the first power FET 108 and to increase conduction by the second power FET 110). In some examples of this scenario 2 option, the sense circuit 116 also accounts for a timing parameter such as whether the sense current provided by the current mirror has been higher than the threshold for more than a threshold amount of time.

For scenario 3, an example of the $V_{DS}$ saturation condition source(s) 113 is the initial power-up operations of the linear switch circuit 104. Due to the $R_{SP}$ of the first power FET 108 being low, a $V_{DS}$ saturation condition of the first power FET 108 increases its vulnerability to thermal runaway, where signals related to the initial power-up operations of the linear switch circuit 104 are an indicator of a $V_{DS}$ saturation condition. Accordingly, for scenario 3, one or more signals related to the initial power-up operations of the linear switch circuit 104 are detected by the sense circuit 116. In response to detecting the one or more signals related to the initial power-up operations of the linear switch circuit 104, the sense circuit 116 provides the control signal 119 to adjust the operations of the first and second power FETs 108 and 110 (e.g., to reduce conduction by the first power FET 108 and to increase conduction by the second power FET 110). In some examples of scenario 3, the sense circuit 116 also accounts for a timing parameter such as whether the one or more signals related to the initial power-up operations have been asserted for more than a threshold amount of time.

For scenario 4, an example of the $V_{DS}$ saturation condition source(s) 113 is the linear switch circuit 104 in a fault condition (e.g., a short-to-ground condition). Due to the $R_{SP}$ of the first power FET 108 being low, a $V_{DS}$ saturation condition of the first power FET 108 increases its vulnerability to thermal runaway, where a fault condition of the linear switch circuit 104 is an indicator of a $V_{DS}$ saturation condition. Accordingly, for scenario 4, one or more signals related to a fault condition of the linear switch circuit 104 are monitored by the sense circuit 116. In one example, the sense circuit 116 detects a voltage and/or current slew rate to identify a fault condition. In another examples, the sense circuit 116 receives a signal from another fault detection circuit included with the linear switch circuit 104. In either case, the sense circuit 116 is configured to respond to a fault condition detection by providing the control signal 119 to adjust the operations of the first and second power FETs 108 and 110 (e.g., to reduce conduction by the first power FET 108 and to increase conduction by the second power FET 110). In some examples of scenario 4, the sense circuit 116 also accounts for a timing parameter such as whether a fault condition exists for more than a threshold amount of time.

When a $V_{DS}$ saturation condition of the first power FET 108 is detected, the sense circuit 116 provides a control signal 119 to the gate drive circuit 114, resulting in updates to the drive signals 115A and 115B such that the second power FET 110 conducts more current and the first power FET 108 conduct less current in response to a $V_{DS}$ saturation condition of the first power FET 108 being detected.

In the example of FIG. 1, the linear switch circuit 104 also includes a thermal protection circuit 117 configured to detect a thermal runaway condition of the second power FET 110. In response to detecting a thermal runaway condition of the second power FET 110, the thermal protection circuit 117 directs the control circuit 112 to turn off the first and second power FETs 108 and 110. In some example embodiments, the thermal protection circuit 117 includes a thermal sense diode or other temperature sensor. When the temperature sensor indicates an overtemperature condition, the thermal protection circuit 117 asserts a control signal 124 to the control circuit 112. In response to receiving the control signal 124, the gate drive circuit 114 of the control circuit 112 turns off the first and second power FETs 108 and 110. To summarize, the first power FET 108 conducts current during normal operations of the linear switch circuit 104. When there is a $V_{DS}$ saturation condition (or related event such as start-up event or a fault condition) of the first power FET 108, the second power FET 110 conducts current instead of the first power FET 108 such that thermal runaway of the first power FET 108 is avoided. If a thermal runaway condition is detected for the second power FET 110, the thermal protection circuit 117 turns off the linear switch circuit 104 by controlling the drive signals 115A and 115B accordingly.

In some example embodiments, the first power FET 108, the second power FET 110, the control circuit 112, and the thermal protection circuit 117 are part of a single monolithic integrated circuit (IC). In other example embodiments, the control circuit 112 is part of a first IC, while the first power FET 108, the second power FET 110, and the thermal protection circuit 117 are part of a second IC. In other example embodiments, the control circuit, the second power FET, and the temperature sensor are part of a first IC, while the first power FET is part of a second IC. Other arrangements may be possible as well, where all ICs related to a linear switch circuit are in a single apparatus (e.g., a system on-a-chip, a multi-chip module, and/or multi-die module).

Figure 2:
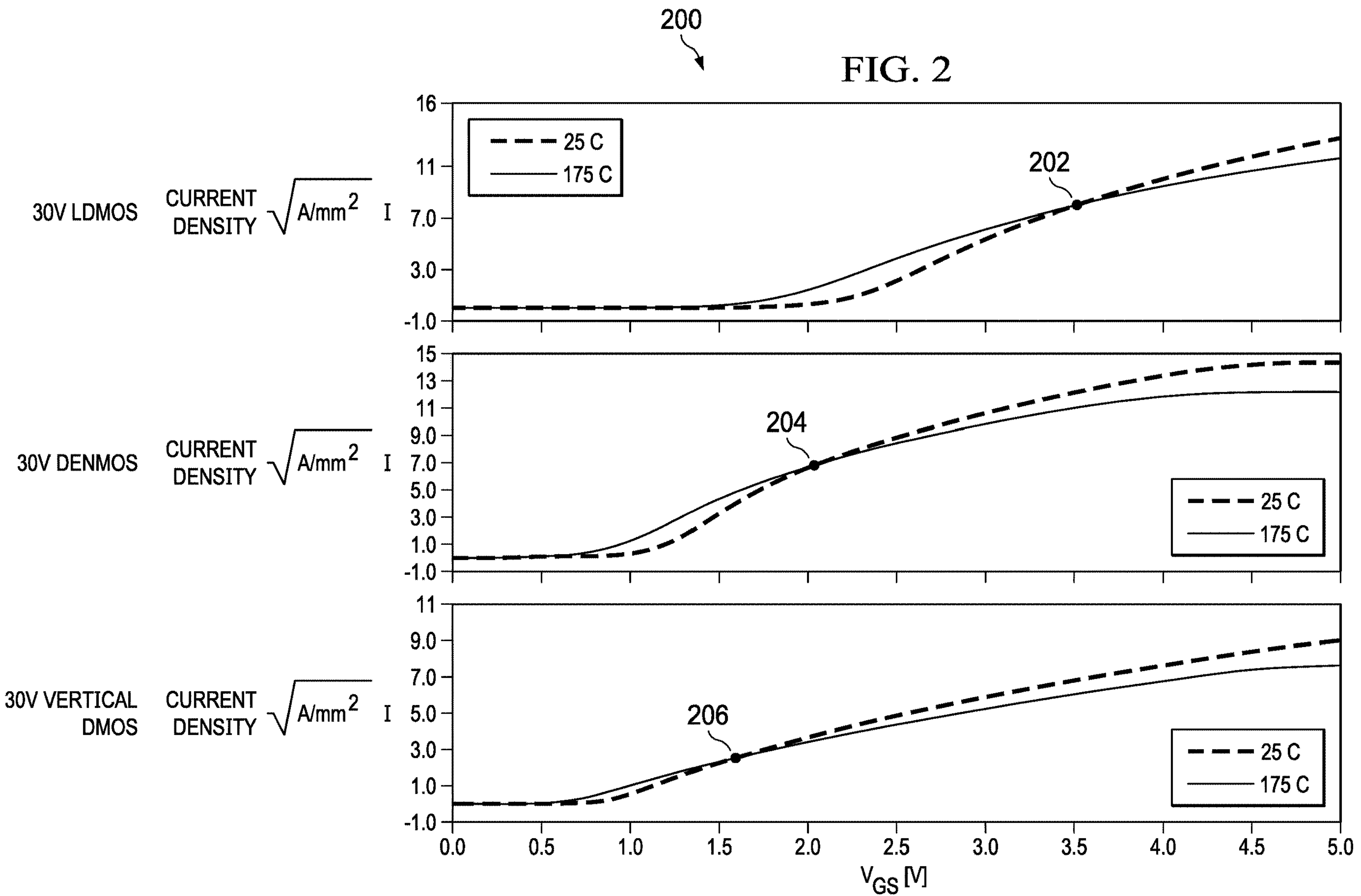
FIG. 2 is a graph showing drain current density as a function of gate-to-source voltage ($V_{GS}$) for different power field-effect transistors (FETs) in accordance with an example embodiment.

FIG. 2 is a graph 200 showing drain current density (expressed as $\sqrt{A/mm^2}$) as a function of $V_{GS}$ for different FETs in accordance with an example embodiment. In graph 200, $V_{GS}$ waveforms are represented for a 30V LDMOS (laterally-diffused metal-oxide semiconductor) power FET, a 30V DENMOS (drain-extended metal-oxide semiconductor) power FET, and a 30V Vertical DMOS (double-diffused metal-oxide semiconductor) power FET at different temperatures. Specifically, the solid lines correspond to $V_{GS}$ waveforms at 175 degrees Celsius and the dashed lines correspond to $V_{GS}$ waveforms at 25 degrees Celsius. Also, the respective temperature compensation points (TCPs) 202, 204, and 206 for each transistor type is shown in graph 200. Specifically, the TCP 202 relates to the 30V LDMOS power FET, the TCP 204 relates to the 30V DENMOS power FET, and the TCP 206 related to the 30V Vertical DMOS power FET. As represented in graph 200, below each of the TCPs 202, 204, and 206, the power FET drain current density increases with temperature, indicating thermal runaway is a possibility in a $V_{DS}$ saturation condition and needs to be accounted for. As can be understood from the graph 200, the TCP increases as the power FET Rsp increases, which means that smaller power FETs are better able to handle high voltages without triggering a thermal runaway condition. In many applications, a linear switch power FET runs well under the TCP or the region where thermal runaway occurs.

Figure 3:
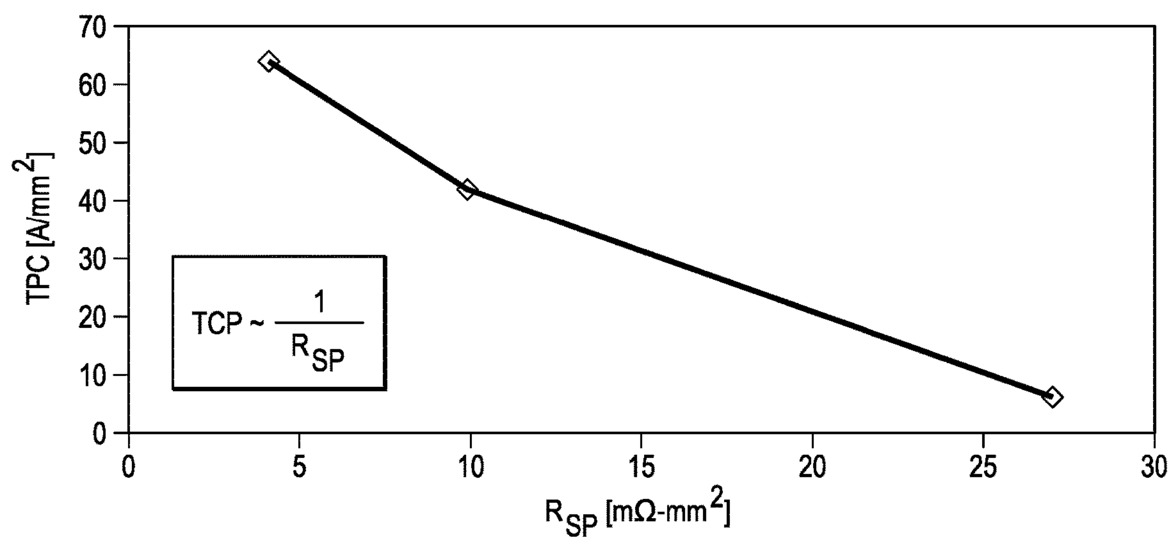
FIG. 3 is a graph showing temperature compensation point (TCP) as a function of on-resistance ($R_{SP}$) for a power FET in accordance with an example embodiment.

FIG. 3 is a graph 300 showing TCP as a function of $R_{SP}$ for a power FET in accordance with an example embodiment. As shown in graph 300, TCP decreases as $R_{SP}$ increases such that TCP can be approximated as $1/R_{SP}$. In the described example embodiment of FIG. 1, the first power FET 108 has a lower $R_{SP}$ than the second power FET 110, and thus the first power FET 108 has a higher TCP than the second power FET 110. Accordingly, the first power FET 108 is more susceptible to thermal runaway than the second power FET 110. As temperature increases, the current density of the first power FET 108 increases more than the current density of the second power FET 110.

Figure 4:
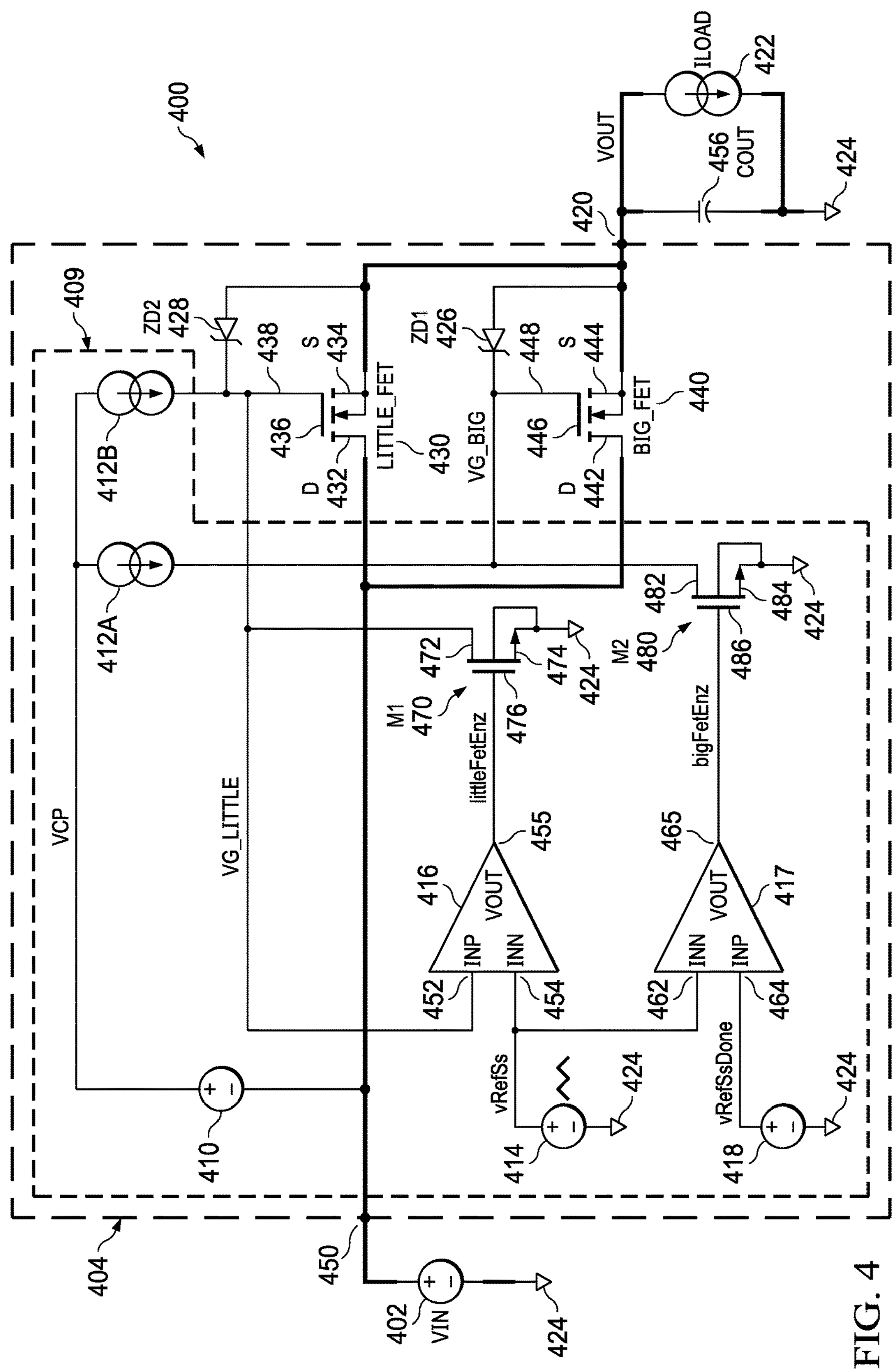
FIG. 4 is a schematic diagram showing a system in accordance with an example embodiment.

FIG. 4 is a schematic diagram showing a system 400 (an example of the system 100 in FIG. 1) in accordance with an example embodiment. Specifically, the system 400 illustrates a soft-start or hot-swap system. As shown, the system 400 includes a VIN source 402 (an example of the VIN source 102 in FIG. 1). The system 400 also includes a first power FET 440 (labeled "BIG_FET", where BIG_FET 440 in FIG. 4 is an example of the first power FET 108 in FIG. 1) and a second power FET 430 (labeled "LITTLE_FET, where LITTLE_FET 430 in FIG. 4 is an example of the second power FET 110 in FIG. 1). In FIG. 4, BIG_FET 440 and LITTLE_FET 430 are part of a linear switch circuit 404 (an example of the linear switch circuit 104 in FIG. 1). As shown, the linear switch circuit 404 includes a power supply terminal 450 coupled to a VIN source 402, where a first end of the VIN source 402 is coupled to the power supply terminal 450 and the second end of the VIN source 402 is coupled to a ground terminal 424. In operation, BIG_FET 440 and LITTLE_FET 430 are controlled to manage the current flow to an output terminal 420 of the linear switch circuit 404. At the output terminal 420, an output capacitor (COUT) 456 is charged by the current through BIG_FET 440 and/or LITTLE_FET 430 to provide an output voltage (VOUT) at the output terminal 420. In the example of FIG. 4, VOUT powers a load represented by a load current source 422. As shown, COUT 456 and the load current source 422 are in parallel between the output terminal 420 and a ground terminal 424.

In the example of FIG. 4, BIG_FET 440 and LITTLE_FET 430 are controlled by a control circuit 409 (an example of the control circuit 112 in FIG. 1), where the control circuit 409 is configured to selectively provide a drive signal VG_BIG 448 for BIG_FET 440 and/or a drive signal VG_LITTLE 438 for LITTLE_FET 430. In the example of FIG. 4, the control circuit 409 includes a first pull-up current source 412A, a second pull-up current source 412B, comparators 416 and 417, a voltage source 410, transistor M1 470, and transistor M2 480. first and second reference voltage sources 414 and 418, More specifically, the drive signal VG_BIG 448 is a function of the current provided by the first pull-up current source 412A powered by a voltage (VCP), and where VCP is provided by the voltage source 410 in series with the VIN source 402 such that VCP is higher than VIN. Operations of the control circuit 409 involve the transistor M2 480 with a first current terminal 482 (e.g., a drain terminal), a second current terminal 484 (e.g., a source terminal), and a control terminal 486 (e.g., a gate terminal), where the first current terminal 482 is coupled to the first pull-up current source 412A, the second current terminal 484 is coupled to the ground terminal 424, and the control terminal 486 is coupled to an output terminal 465 of the comparator 417. Operations of the control circuit 409 also involve the transistor M1 470 with a first current terminal 472 (e.g., a drain terminal), a second current terminal 474 (e.g., a source terminal), and a control terminal 476 (e.g., a gate terminal), where the first current terminal 472 is coupled between the second pull-up current source 412B, the second current terminal 474 is coupled to the ground terminal 424, and the control terminal 486 is coupled to an output terminal 455 of the comparator 416. When the transistor M2 480 is turned on by a control signal (bigFetEnz) from the output terminal 465 of the comparator 417, a gate voltage (VG_BIG 448) is provided to the control terminal 446 of BIG_FET 440, where VG_BIG 448 is a function of the current provided by the first pull-up current source 412A and the $R_{SP}$ of transistor M2 480. Also, the drive signal VG_LITTLE 438 for LITTLE_FET 430 is a function of the current provided by the second pull-up current source 412B powered by VCP. When the transistor M1 470 is turned on by a control signal (littleFetEnz) from the output terminal 455 of the comparator 416, a gate voltage (VG_LITTLE) is provided to the control terminal 436 of LITTLE_FET 430, where VG_LITTLE is a function of the current provided by the second pull-up current source 412B and the $R_{SP}$ of transistor M1 470. In FIG. 4, a first Zener diode (ZD1) 426 is between the output terminal 420 and the control terminal 446 of BIG_FET 440 to clamp $V_{GS}$ of BIG_FET 440. Also, a second Zener diode (ZD2) 428 is between the output terminal 420 and the control terminal 436 of LITTLE_FET 430 to clamp $V_{GS}$ of LITTLE_FET 430.

In the example of FIG. 4, bigFetEnz at output terminal 465 of the comparator 417 is based on comparison of a first reference voltage vRefSs (provided by the first reference voltage source 414) at INN input 462 with a second reference voltage vRefSsDone (provided by the second reference voltage source 418) at INP input 464. Also, littleFetEnz at output terminal 455 of the comparator 416 is based on comparison of the first reference voltage vRefSs at INN input 454 with VG_LITTLE at INP input 452. In some example embodiments, the first reference voltage vRefSs from the first reference voltage source 414 provides an indication of when a soft-start interval begins and the second reference voltage vRefSsDone from the second reference voltage source 418 provides an indication of when a soft-start interval ends.

In operation, LITTLE_FET 430 is turned on during the soft-start interval to conduct current to the output terminal 420. Once the soft-start interval ends (when VOUT at the output terminal 420 is charged up), BIG_FET 440 is turned on to conduct current to the output terminal 420. Because BIG_FET 440 is more susceptible to thermal runaway and is more efficient compared to LITTLE_FET 430, the linear switch circuit 404 will avoid thermal runaway of BIG_FET 440 during the start-up event, then switch from LITTLE_FET 430 to BIG_FET 440 during normal operations to improve efficiency of the linear switch circuit 404 since the $R_{SP}$ of BIG_FET 440 is lower than the $R_{SP}$ of LITTLE_FET 430.

If a load (e.g., the load current source 422) is enabled during soft-start, the current will flow through LITTLE_FET 430. In some example embodiments, LITTLE_FET 430 is optimized to have a lower TCP and has the thermal sense diode aligned with it, enabling reliable thermal protection. One benefit of the described system 400 is that current sensing is avoided, which simplifies safe operating area (SOA) protection operations of the linear switch circuit 404.

Figure 5:
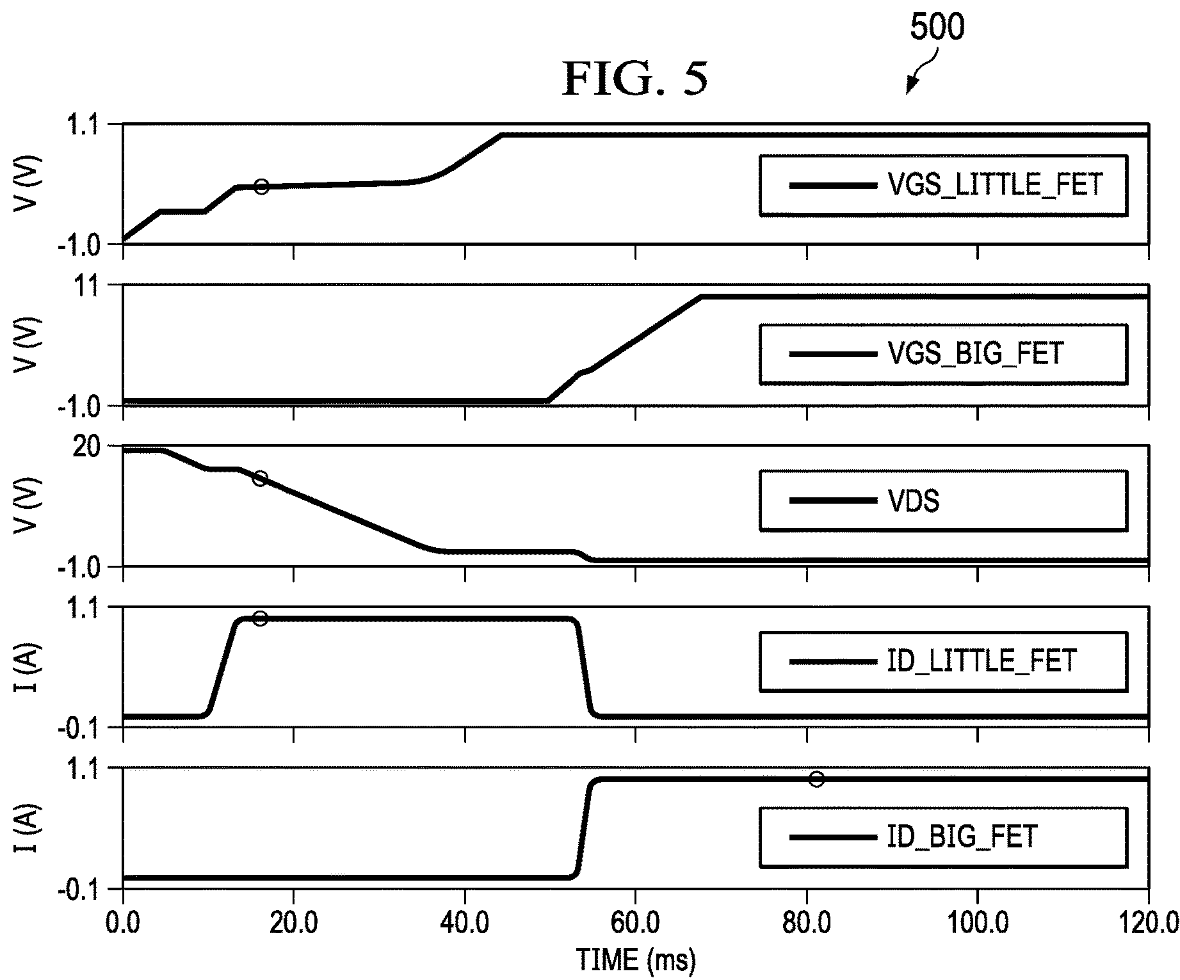
FIG. 5 is a graph showing signals of a linear switch circuit representing a soft-start fault scenario in accordance with an example embodiment.

FIG. 5 is a graph 500 showing signals of a linear switch circuit representing a soft-start fault scenario in accordance with an example embodiment (e.g., the system 400 of FIG. 4). In the graph 500, the represented waveforms include a gate-to-source voltage of LITTLE_FET 430 (VGS_LITTLE_FET), a gate-to-source voltage of BIG_FET 440 (VGS_BIG_FET), a drain-to-source voltage of BIG_FET 440 (VDS), a drain current of LITTLE_FET 430 (ID_LITTLE_FET), and a drain current of BIG_FET 440 (ID_BIG FET) as a function of time. For the graph 500, assumptions include: 1) a soft-start interval with VIN=20V into a 1 A load that is engaged once VOUT exceeds 4V; 2) all load current is conducted through the LITTLE_FET 430; 3) LITTLE_FET 430 is sized so that its $V_{GS}$ with a 1 A load is above a target TCP; and 4) a thermal sense diode placed in the center of LITTLE_FET 430 to track the highest FET temperature well, allowing for reliable triggering of thermal shutdown protection.

As shown in graph 500, VGS_LITTLE_FET initially increases, VDS decreases, and ID_LITTLE_FET goes high during a time corresponding to a start-up event. After the start-up event, VDS stays low and BIG_FET 440 is turned on, which results in an increase in VGS_BIG_FET, ID_LITTLE_FET going low, and ID_BIG FET going high. As needed, a linear switch circuit is able to switch back and forth between BIG_FET 440 and LITTLE_FET 430 to provide current to an output terminal (e.g., the output terminal 420), where BIG_FET 440 is used for normal operations and LITTLE_FET 430 is used when a $V_{DS}$ saturation conditions of BIG_FET 440 is detected.

Figure 6:
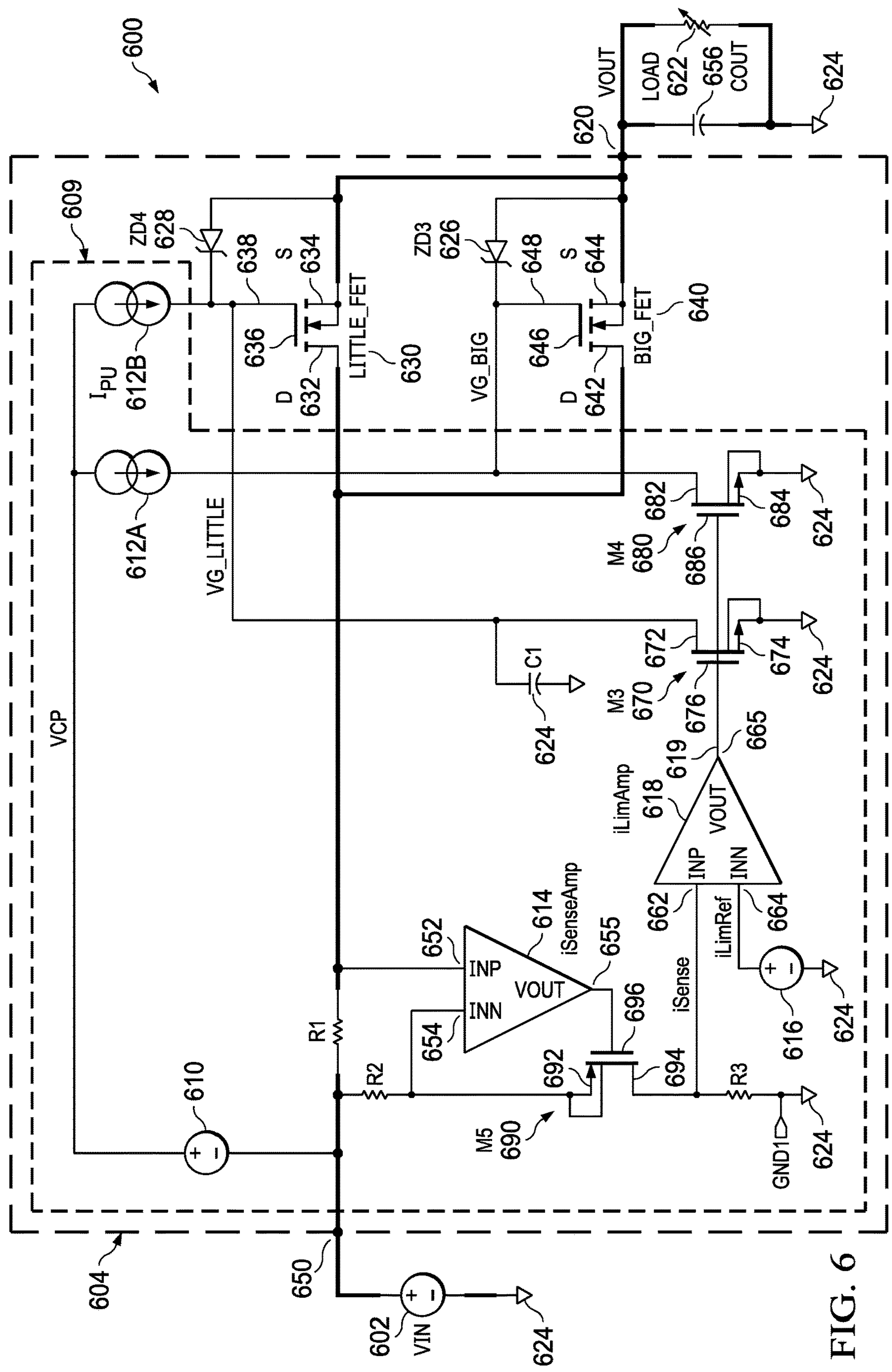
FIG. 6 is a schematic diagram showing another system in accordance with an example embodiment.

FIG. 6 is a schematic diagram showing another system 600 (an example of the system 100 in FIG. 1) in accordance with an example embodiment. Specifically, the system 600 corresponds to a current limit system. As shown, the system 600 includes a VIN source 602 (an example of the VIN source 102 in FIG. 1). The system 600 also includes a first power FET 640 (labeled "BIG_FET", where BIG_FET 640 in FIG. 6 is an example of the first power FET 108 in FIG. 1) and a second power FET 630 (labeled "LITTLE_FET", where LITTLE_FET 630 in FIG. 6 is an example of the second power FET 110 in FIG. 1). In FIG. 6, BIG_FET 640 and LITTLE_FET 630 are part of a linear switch circuit 604 (an example of the linear switch circuit 104 in FIG. 1). As shown, the linear switch circuit 604 includes a power supply terminal 650 coupled to a VIN source 602, where a first end of the VIN source 602 is coupled to the power supply terminal 650 and the second end of the VIN source 602 is coupled to a ground terminal 624. In operation, BIG_FET 640 and LITTLE_FET 630 are controlled to manage the current flow to an output terminal 620 of the linear switch circuit 604. At the output terminal 620, an output capacitor (COUT) 656 is charged by the current through BIG_FET 640 and/or LITTLE_FET 630 to provide an output voltage (VOUT) at the output terminal 620. In the example of FIG. 6, VOUT is provided to a load represented by a variable resistor 622. As shown, COUT 656 and the variable resistor 622 are in parallel between the output terminal 620 and the ground terminal 624.

In the example of FIG. 6, BIG_FET 640 and LITTLE_FET 630 are controlled by a control circuit 609 (an example of the control circuit 112 in FIG. 1), where the control circuit 609 is configured to selectively provide a drive signal VG_BIG 648 for BIG_FET 440 and/or a drive signal VG_LITTLE 638 for LITTLE_FET 430. In the example of FIG. 6, the control circuit 609 includes the first and second pull-up current sources 612A and 612B, transistor M3 670, transistor M4 680, comparators 614 and 618, the voltage sources 610 and 616, resistor R1, resistor R2, transistor M5 690, and resistor R3. More specifically, the drive signal VG_BIG 648 is a function of the current provided by a first pull-up current source 612A powered by VCP, and where VCP is provided by a voltage source 610 in series with VIN source 602 such that VCP is higher than VIN. Operations of the control circuit 609 also involve the transistor M4 680 with a first current terminal 682 (e.g., a drain terminal), a second current terminal 684 (e.g., a source terminal), and a control terminal 686 (e.g., a gate terminal, where the first current terminal 682 is coupled to the first pull-up current source 612A, the second current terminal 684 is coupled to the ground terminal 624, and the control terminal 686 is coupled to a control signal 619 provided by an output 665 of the comparator 618. Operations of the control circuit 609 also involve the transistor M3 670 with a first current terminal 672 (e.g., a drain terminal), a second current terminal 674 (e.g., a source terminal), and a control terminal 676 (e.g., a gate terminal), where the first current terminal 672 is coupled the second pull-up current source 612B, the second current terminal 674 is coupled to the ground terminal 624, and the control terminal 676 is coupled to the control signal 619 provided by an output 665 of the comparator 618.

When the transistor M4 680 is turned on by the control signal 619, a drive signal VG_BIG 648 is provided to the control terminal 646 of BIG_FET 640, where the driver signal VG_BIG 648 is a function of the current provided by the first pull-up current source 612A and the $R_{SP}$ of transistor M4 680. Also, the drive signal VG_LITTLE 638 for LITTLE_FET 630 is a function of the current provided by a second pull-up current source 612B powered by VCP. When the transistor M3 670 is turned on by the control signal 619, a drive signal VG_LITTLE 638 is provided to the control terminal 636 of LITTLE_FET 630, where VG_LITTLE 638 is a function of the current provided by the second pull-up current source 612B and the $R_{SP}$ of M3. As shown, a capacitor C1 coupled to the control terminal 636 of LITTLE_FET 630 is used to the drive signal VG_LITTLE 638. In FIG. 6, a first Zener diode (ZD3) 626 is between the output terminal 620 and the control terminal 646 of BIG_FET 640 to clamp $V_{GS}$ of BIG_FET 640. Also, a second Zener diode (ZD4) 628 is between the output terminal 620 and the control terminal 636 of LITTLE_FET 630 to clamp $V_{GS}$ of LITTLE_FET 636.

As shown, the control signal 619 to transistor M3 670 and transistor M4 680 is provided by the comparator 618, which is configured to compare a sense current signal (iSense) at INP input 662 with a reference current value (iLimRef) at INN input 664, where iLimRef is provided the voltage source 616. More specifically, iSense is generated using sense resistors R1 and R2, where a voltage drop due to R1 is compared to the voltage drop due to R2 by the comparator 614. The output 655 of the comparator 614 is coupled to the control terminal of the transistor M5 690 such that transistor M5 690 is turned on when the current to the output terminal 620 is greater than a threshold.

As shown, the transistor M5 690 includes a first current terminal 692 (e.g., a source terminal), a second current terminal 694 (e.g., a drain terminal), and a control terminal 686 (e.g., a gate terminal). When transistor M5 690 is turned on, a voltage is generated by the current flow through transistor M5 690 due to the resistor R3, which is coupled between the second current terminal 694 of transistor M5 690 (also coupled to the INP input 662 of the comparator 618) and the ground terminal 624. To summarize, iSense provides an indication of when $V_{DS}$ for BIG_FET 640 will be greater than a threshold corresponding to a $V_{DS}$ saturation condition for BIG_FET 640. In other examples, another technique is used to determine when there is a $V_{DS}$ saturation condition for BIG_FET 640.

In operation, LITTLE_FET 630 conducts current to the output terminal 620 when the current to the output terminal 620 exceeds a threshold. Otherwise, BIG_FET 640 conducts current to the output terminal 620. To steer current into LITTLE_FET 630 during current limit conditions, the size ratio of the transistor M4 680 relative to the transistor M3 670 is set (e.g., 5:1, where with transistor M4 680 is 5 times larger than transistor M3 670) to strongly pull down on VG_BIG 648 at the control terminal 646 of BIG_FET 640 when the loop is in regulation. When in regulation, the drain current of transistor M3 670 equals the pull-up current ($I_{PU}$) from the pull-up current ($I_{PU}$) source 612B. In such examples, transistor M4 680 is larger than transistor M3 670 (with regard to W or W/L) and turns off BIG_FET 640 while in regulation.

Figure 7:
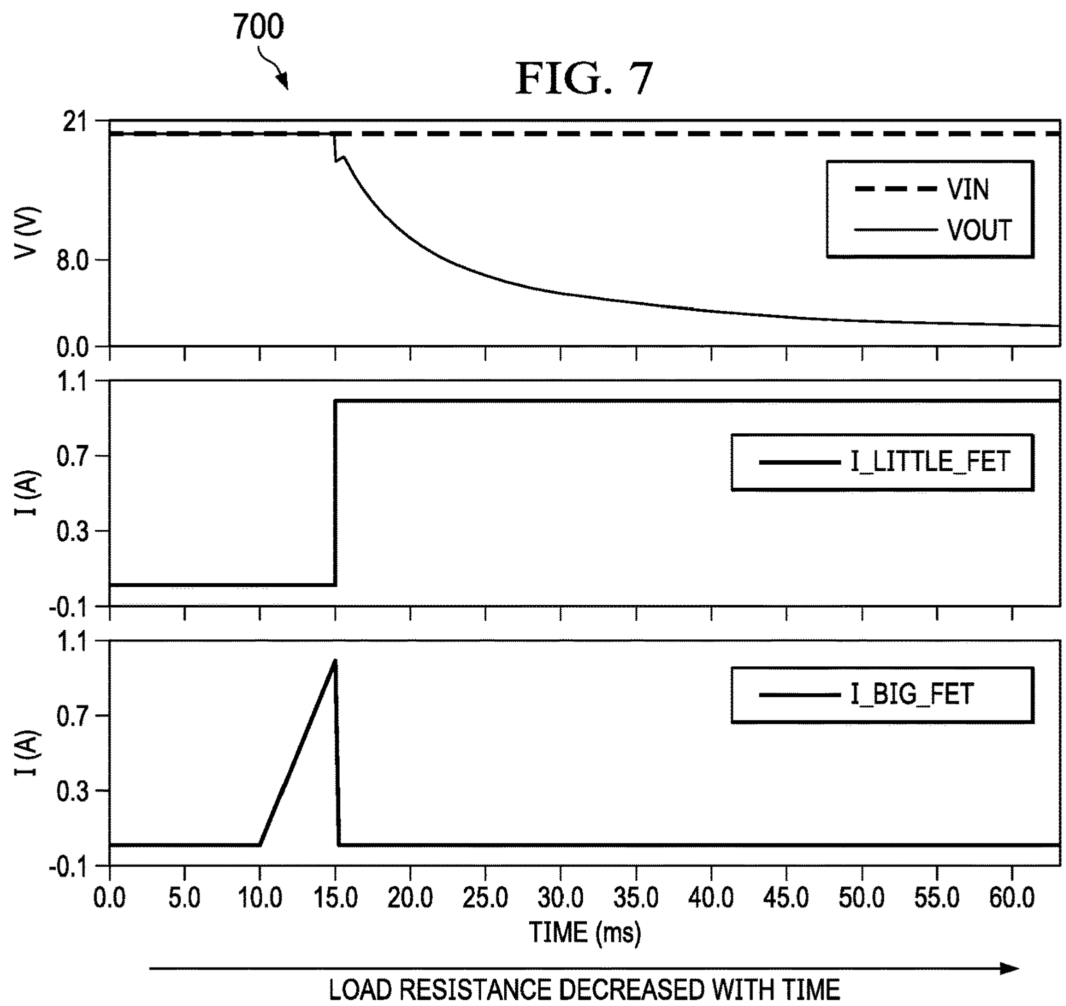
FIG. 7 is a graph showing signals of a linear switch circuit representing a current limit scenario as a function of time in accordance with an example embodiment.

FIG. 7 is a graph 700 showing signals of a linear switch circuit representing a current limit scenario as a function of time in accordance with an example embodiment (e.g., the system 600 of FIG. 6). In the graph 700, the represented waveforms include VIN, VOUT, a current through LITTLE_FET 630 (I_LITTLE_FET), and a current through BIG_FET 640 (I_BIG FET). For the graph 700, assumptions include: 1) both power FETs are initially on; 2) the current limit reference (e.g., iLimRef in FIG. 6) set to 1.0 A; 3) the load resistance is ramped down (linear with 1/RLOAD); 4) upon entering the current limit condition, all the load current is steered into LITTLE_FET 630; and 5) the size of LITTLE_FET 630 or type of device selected for LITTLE_FET 630 is less vulnerable to thermal runaway under current limit conditions compared to BIG_FET 640. In some examples, a thermal sense diode is placed in the center of LITTLE_FET 630 to detect and respond to a thermal runaway condition for LITTLE_FET 630 as needed. As represented in graph 700, a load increases (or load resistance decreases resulting in a higher load current) causing I_BIG_FET to increase and eventually leads to a drop in VOUT. Once a current limit condition is reached, I_BIG_FET drops (BIG_FET in turned off) and I_LITTLE_FET goes high (LITTLE_FET 630 is turned on).

Figure 8:
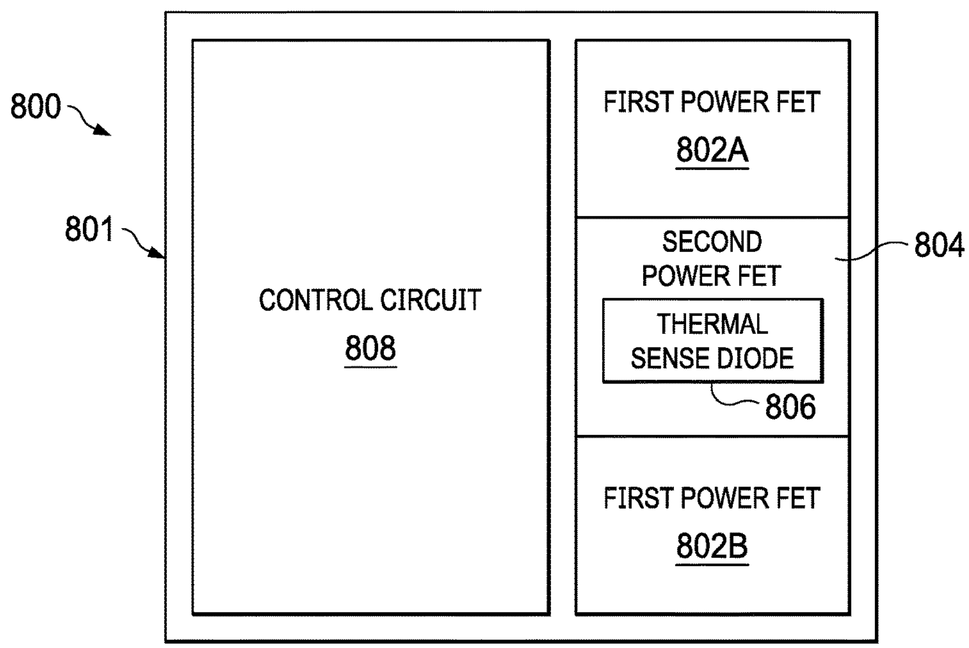
FIG. 8-10 are top views showing integrated circuit (IC) layouts for linear switch circuit components in accordance with different example embodiments.
Figure 9:
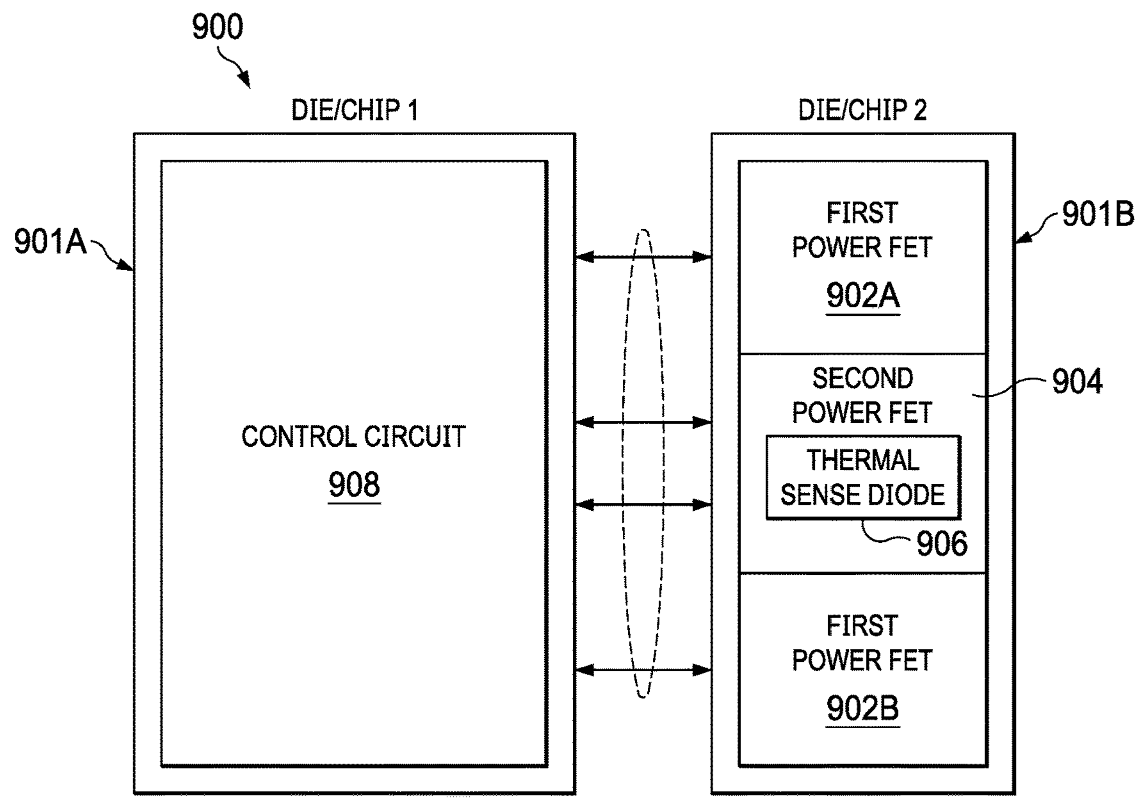
Figure 10:
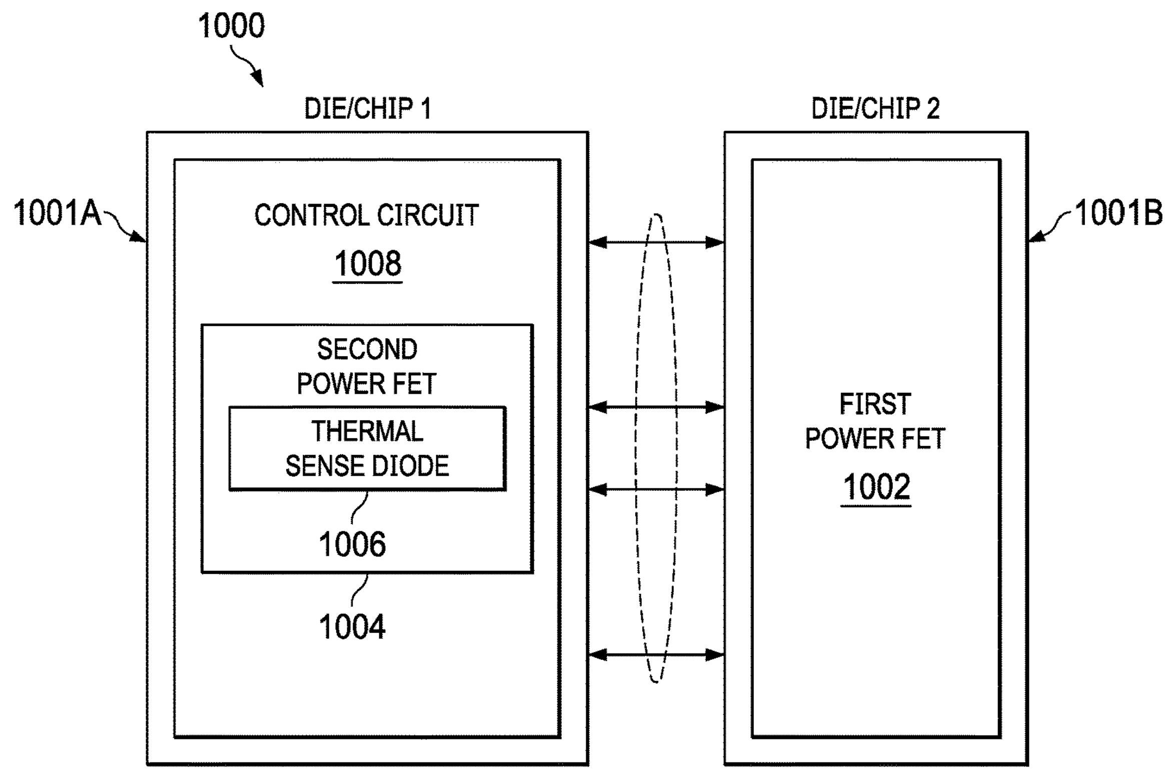

FIG. 8-10 are top views showing IC layouts for linear switch circuit components in accordance with different example embodiments. In FIG. 8, a monolithic IC arrangement 800 is represented, where the monolithic IC arrangement 800 includes a single IC, chip, or die 801 with first power FET areas 802A and 802B (e.g., related to the first power FET 108 in FIG. 1, BIG_FET 440 in FIG. 4, or BIG_FET 640 in FIG. 6), a second power FET area 804 (e.g., related to the second power FET 110 in FIG. 1, LITTLE_FET 430 in FIG. 4, or the LITTLE_FET 630 in FIG. 6), a thermal sense diode 806 (e.g., related to the thermal protection circuit 117 in FIG. 1) aligned with the second power FET area 804, and a control circuit area 808 (e.g., related to the control circuit 112 in FIG. 1, or related control circuit components in FIGS. 4 and 6). With the monolithic IC arrangement 800, thermal runaway related to the first power FET areas 802A and 802B is avoided as described herein. Also, detection of thermal runaway (e.g., using the thermal sense diode 806) of the second power FET area 804 is relatively simple due to the smaller size of the second power FET area 804 compared to the first power FET areas 802A and 802B.

In FIG. 9, a multi-chip module (MCM) arrangement 900 is represented, where the MCM arrangement 900 includes a first IC, chip, or die 901A with a control circuit 908 (e.g., related to the control circuit 112 in FIG. 1, the control circuit 409 in FIG. 4, or the control circuit 609 in FIG. 6). The MCM arrangement 900 also includes a second IC chip or die 901B in communication with the first IC, chip, or die 901A. As shown, the second IC, chip, or die 901B include first power FET areas 902A and 902B (e.g., related to the first power FET 108 in FIG. 1, BIG_FET 440 in FIG. 4, or BIG_FET 640 in FIG. 6), a second power FET area 904 (e.g., related to the second power FET 110 in FIG. 1, LITTLE_FET 430 in FIG. 4, or LITTLE_FET 630 in FIG. 6), a thermal sense diode 906 (e.g., related to the thermal protection circuit 117 in FIG. 1) aligned with the second power FET area 904. With the MCM arrangement 900, thermal runaway related to the first power FET areas 902A and 902B is avoided as described herein. Also, detection of thermal runaway (e.g., using the thermal sense diode 906) of the second power FET area 904 is relatively simple due to the smaller size of the second power FET area 904 compared to the first power FET areas 902A and 902B.

In FIG. 10, another MCM arrangement 1000 is represented, where the MCM arrangement 1000 includes a first IC, chip, or die 1001A with a control circuit 1008 (e.g., related to the control circuit 112 in FIG. 1, or related control circuit components in FIGS. 4 and 6), the second power FET area 1004 (e.g., related to the second power FET 110 in FIG. 1, LITTLE_FET 430 in FIG. 4, or LITTLE_FET 630 in FIG. 6), a thermal sense diode 1006 (e.g., related to the thermal protection circuit 117 in FIG. 1) aligned with the second power FET area 1004. The MCM arrangement 1000 also includes a second IC, chip, or die 1001B with a first power FET area 1002 (e.g., related to the first power FET 108 in FIG. 1, BIG_FET 440 in FIG. 4, or BIG_FET 640 in 6). With the MCM arrangement 1000, thermal runaway related to the first power FET areas 1002 is avoided as described herein. Also, detection of thermal runaway (e.g., using the thermal sense diode 1006) of the second power FET area 1004 is relatively simple due to the smaller size of the second power FET area 1004 compared to the first power FET area 1002. In some examples, the first power FET area 1002 is optimized for low $R_{SP}$, and the second power FET area 1004 is optimized for compliance with a thermal SOA target.

The described embodiments provide improved $V_{DS}$ saturation condition protection for the power FETs of a linear switch circuit or related system. In some example embodiments (e.g., linear current limit or soft-start/hot-swap switches), two power FETs are used instead of one power FET. The first power FET is larger and is optimized for $R_{SP}$. The second power FET is smaller or is biased above the TCP using the same FET technology as the first power FET. Another option is to use a different FET type that has a lower TCP for the second power FET. The first power FET is fully on and conducts most of the load current under normal low-$V_{DS}$ operating conditions. During a start-up event or fault condition at high $V_{DS}$ voltages, the second power FET conducts the current. Steering current into the second power FET provides control of where the hot spot location will be and where a thermal sense diode could be placed. With the described embodiments, the hot spot location is more likely to reside in the smaller second power FET, which facilitates detection using a traditional thermal sense diode.

Figure 11:
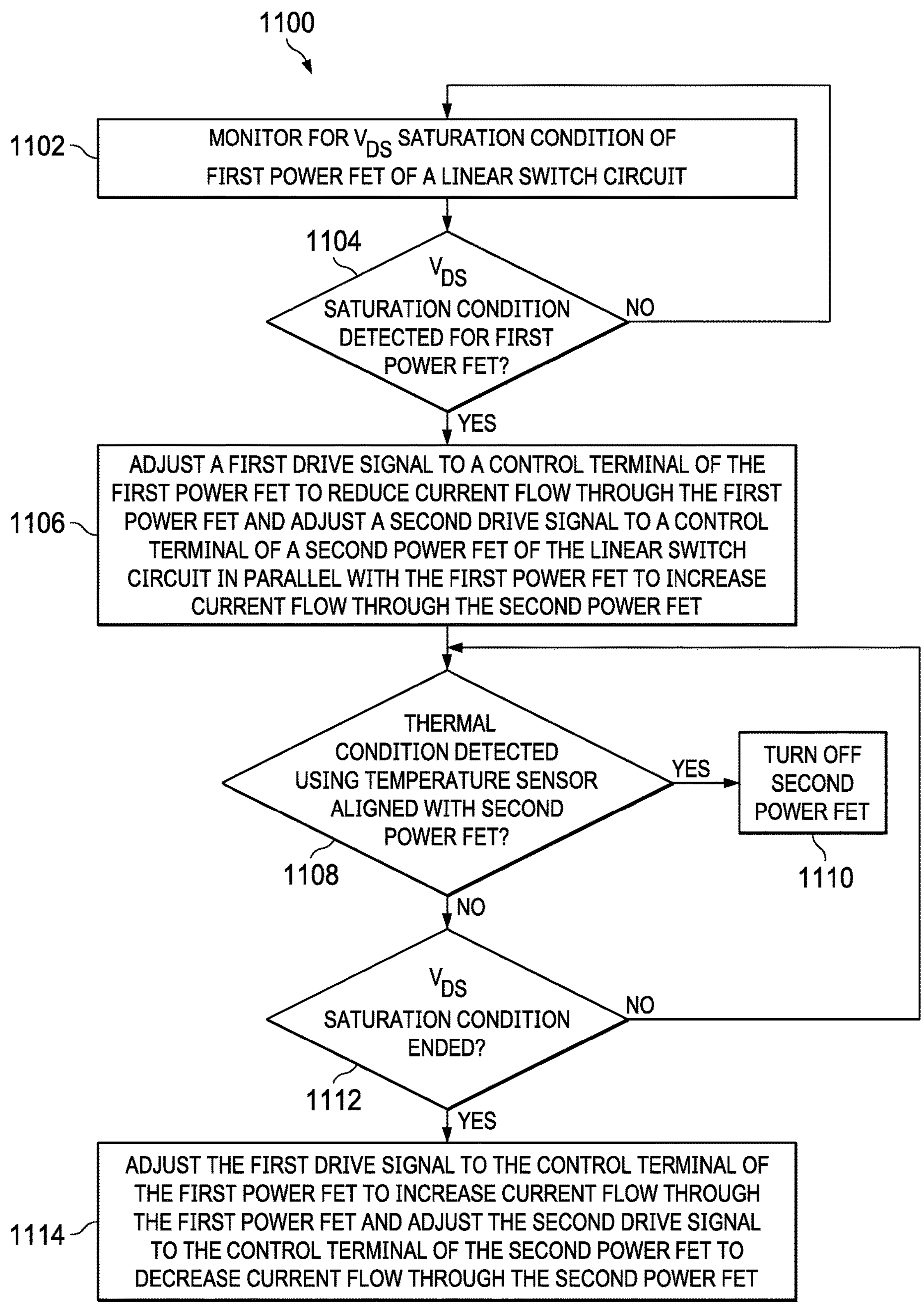
FIG. 11 is a flowchart showing a linear switch circuit control method in accordance with an example embodiment.

FIG. 11 is a flowchart showing a linear switch circuit control method 1100 in accordance with an example embodiment. The linear switch circuit control method 1100 is performed, for example, by a control circuit of a linear switch device (e.g., the control circuit 112 in FIG. 1, the control circuit 409 in FIG. 4, or the control circuit 609 in FIG. 6). As shown, the method 1100 includes monitoring for a $V_{DS}$ saturation condition of a first power FET (e.g., first power FET 108 in FIG. 1, BIG_FET 440 in FIG. 4, BIG_FET 640 in FIG. 6) at block 1102. If the $V_{DS}$ saturation condition is not detected for the first power FET (decision block 1104), the method 1100 continues to perform the operations of block 1102. If the $V_{DS}$ saturation condition is detected for the first power FET (decision block 1104), a first drive signal to a control terminal of the first power FET is adjusted to reduce current flow through the first power FET and a second drive signal to a control terminal of a second power FET (e.g., second power FET 110 in FIG. 1, LITTLE_FET 430 in FIG. 4, LITTLE_FET 630 in FIG. 6) of the linear switch circuit in parallel with the first power FET is adjusted to increase current flow through the second power FET at block 1106. If a thermal condition (e.g., overtemperature condition) is not detected using a temperature sensor aligned with the second power FET (decision block 1108) and the $V_{DS}$ saturation condition of the first power FET has not ended (decision block 1112), the method 1100 returns to decision block 1108. If the thermal condition (e.g., overtemperature condition) is detected using the temperature sensor aligned with the second power FET (decision block 1108), the second power FET is turned off at block 1110. The first power FET may also be turned off at block 1110. If a thermal condition is not detected using the temperature sensor aligned with the second power FET (decision block 1108) and the $V_{DS}$ saturation condition of the first power FET has ended (decision block 1112), the first drive signal to the control terminal of the first power FET is adjusted to increase current flow through the first power FET and the second drive signal to the control terminal of the second power FET is adjusted to decrease current flow through the second power FET at block 1114. The method 1100 may be repeated as needed.

Certain terms have been used throughout this description and claims to refer to particular system components. As one skilled in the art will appreciate, different parties may refer to a component by different names. This document does not intend to distinguish between components that differ only in name but not in their respective functions or structures. In this disclosure and claims, the terms "including" and "comprising" are used in an open-ended fashion, and thus should be interpreted to mean "including, but not limited to . . . ."

The term "couple" is used throughout the specification. The term may cover connections, communications, or signal paths that enable a functional relationship consistent with the description of the present disclosure. For example, if device A generates a signal to control device B to perform an action, in a first example device A is coupled to device B by direct connection, or in a second example device A is coupled to device B through intervening component C if intervening component C does not alter the functional relationship between device A and device B such that device B is controlled by device A via the control signal generated by device A.

The above discussion is meant to be illustrative of the principles and various embodiments of the present invention. Numerous variations and modifications will become apparent to those skilled in the art once the above disclosure is fully appreciated.

What is claimed is:

1. A system, comprising:

a first field-effect transistor (FET) having a first gate, a first drain, and a first source, the first FET comprising a first channel having a first channel width;

a second FET having a second gate, a second source, and a second drain, the second FET comprising a second channel having a second channel width smaller than the first channel width, the second drain coupled to the first drain and the second source coupled to the first source; and a control circuit coupled to the first gate and to the second gate, wherein the control circuit is configured to:

detect a drain-to-source voltage ($V_{DS}$) saturation condition related to the first FET;

adjust a first drive signal to the first gate to reduce a first current through the first FET responsive to detecting the $V_{DS}$ saturation condition; and adjust a second drive signal to the second gate to increase a second current through the second FET responsive to detecting the $V_{DS}$ saturation condition.

2. The system of claim 1, wherein the first FET and the second FET are components of a single integrated circuit (IC).

3. The system of claim 2, wherein the IC comprises:

a first portion of the first FET;

a second portion of the first FET; and the second FET, wherein the first and second portions of the first FET are on opposite sides of the second FET.

4. The system of claim 2, wherein the control circuit is in the IC.

5. The system of claim 2, wherein the IC is a first IC, and wherein the control circuit is in a second IC.

6. The system of claim 2, further comprising a temperature sensor aligned with the second FET.

7. The system of claim 1, wherein the first FET is in a first IC, and wherein the control circuit and the second FET are in a second IC.

8. The system of claim 1, wherein the control circuit comprises:

a sense circuit configured to detect the $V_{DS}$ saturation condition; and a gate drive circuit configured to provide a first gate drive signal to the first FET while the $V_{DS}$ saturation condition is not met, and to provide a second gate drive signal to the second FET while the $V_{DS}$ saturation condition is met.

9. The system of claim 1, wherein the control circuit comprises:

a sense circuit configured to detect a start-up event associated with the $V_{DS}$ saturation condition; and a gate drive circuit configured to provide a first gate drive signal to the first FET while the $V_{DS}$ saturation condition is not met, and to provide a second gate drive signal to the second FET while the $V_{DS}$ saturation condition is met.

10. The system of claim 1, wherein the control circuit comprises:

a sense circuit configured to detect a fault condition associated with the $V_{DS}$ saturation condition; and a gate drive circuit configured to provide a first gate drive signal to the first FET while the $V_{DS}$ saturation condition is not met, and to provide a second gate drive signal to the second FET while the $V_{DS}$ saturation condition is met.

11. An integrated circuit (IC), comprising:

a first field-effect transistor (FET) comprising a first channel having a first channel width;

a second FET in parallel with the first FET, the second FET comprising a second channel having a second channel width smaller than the first channel width; and a control circuit coupled to the first FET and to the second FET, wherein the control circuit is configured to increase a first gate drive signal to the second FET and to decrease a second gate drive signal to the first FET in response to detecting a drain-to-source voltage ($V_{DS}$) saturation condition related to the first FET.

12. The IC of claim 11, wherein the IC comprises:

a first area comprising the first FET;

a second area comprising the control circuit and the second FET, wherein the first area is separate from the second area, and wherein portions of the control circuit are on opposite sides of the second FET.

13. The IC of claim 12, further comprising a temperature sensor aligned with the second FET.

14. The IC of claim 11, wherein the IC comprises:

a first portion of the first FET;

a second portion of the first FET; and the second FET, wherein the first and second portions of the first FET are on opposite sides of the second FET.

15. The IC of claim 14, further comprising a temperature sensor aligned with the second FET.

16. A circuit, comprising:

a first field-effect transistor (FET) having a first gate, a frist drain, and a first source, the first FET comprising a first channel having a first channel width;

a second FET having a second gate, a second drain, and a second source, the second FET comprising a second channel having a second width smaller than the first channel width, the second drain coupled to the first drain and the second source coupled to the first sourde; and a control circuit comprising:

a sense circuit; and a gate drive circuit coupled to the sense circuit, to the first gate, and to the second gate.

17. The circuit of claim 16, wherein the first FET and the second FET are components of a single integrated circuit (IC).

18. The circuit of claim 17, wherein the IC comprises:

a first portion of the first FET;

a second portion of the first FET; and the second FET, wherein the first and second portions of the first FET are on opposite sides of the second FET.

19. The circuit of claim 17, wherein the control circuit is included with the IC.

20. The circuit of claim 17, wherein the IC is a first IC, and wherein the control circuit is part of a second IC.

21. The circuit of claim 17, further comprising a temperature sensor aligned with the second FET.

22. The circuit of claim 16, wherein the sense circuit is configured to detect a $V_{DS}$ saturation condition or an event associated with the $V_{DS}$ saturation condition, and wherein the gate drive circuit is configured to:

provide a first gate drive signal to the first FET when the $V_{DS}$ saturation condition is not met; and provide a second gate drive signal to the second FET when the $V_{DS}$ saturation condition is met.

* * * * *